United States Patent
Wang

(10) Patent No.: US 9,150,741 B2
(45) Date of Patent: Oct. 6, 2015

(54) PRODUCING METHOD OF INK COMPOSITION FOR FORMING ABSORPTION LAYER OF THIN FILM CELLS

(71) Applicant: Chi-Jie Wang, Tainan (TW)

(72) Inventor: Chi-Jie Wang, Tainan (TW)

( * ) Notice: Subject to any disclaimer, the term of this patent is extended or adjusted under 35 U.S.C. 154(b) by 219 days.

(21) Appl. No.: 13/727,497

(22) Filed: Dec. 26, 2012

(65) Prior Publication Data

US 2013/0112108 A1    May 9, 2013

Related U.S. Application Data

(63) Continuation-in-part of application No. 12/510,275, filed on Jul. 28, 2009, now abandoned.

(51) Int. Cl.
| | |
|---|---|
| *H01B 1/02* | (2006.01) |
| *H01B 1/22* | (2006.01) |
| *C09D 11/02* | (2014.01) |
| *H01L 31/032* | (2006.01) |
| *C09D 11/52* | (2014.01) |

(52) U.S. Cl.
CPC ............... *C09D 11/02* (2013.01); *C09D 11/52* (2013.01); *H01L 31/0322* (2013.01); *Y02E 10/541* (2013.01)

(58) Field of Classification Search
CPC .... H01L 31/0322; B82Y 30/00; B82Y 10/00; C09D 11/02; C09D 11/037; C09D 11/52
USPC .......... 136/244; 423/508; 438/93; 106/31.13, 106/31.92; 347/105; 556/110
See application file for complete search history.

(56) References Cited

U.S. PATENT DOCUMENTS

| | | | | |
|---|---|---|---|---|
| 2006/0001726 A1* | 1/2006 | Kodas et al. | ................... | 347/105 |
| 2010/0120192 A1* | 5/2010 | Jung et al. | ................... | 438/93 |
| 2010/0260661 A1* | 10/2010 | Hwang et al. | ................... | 423/508 |

FOREIGN PATENT DOCUMENTS

| | | | | | |
|---|---|---|---|---|---|
| EP | CN 101017862 | * | 8/2007 | .............. | H01L 31/18 |
| EP | WO 2009-041758 | * | 4/2009 | .............. | C01G 3/00 |
| EP | WO 2009-064056 | * | 5/2009 | .............. | B82B 3/00 |

* cited by examiner

*Primary Examiner* — Khanh Tuan Nguyen
(74) *Attorney, Agent, or Firm* — Juan Carlos A. Marquez; Bacon & Thomas PLLC

(57) ABSTRACT

The present invention discloses a producing method for an ink composition for forming absorption layers of thin film cells. The ink composition comprising CIGS or CIS nanocrystals and a chelating agent specified for the CIGS or CIS nanocrystals. According to the present invention, the mixture comprising at least two substances selected from the group consisting of Group IB elements, Group IIIA elements, Group VIA elements, salts of Group IB elements, salts of Group IIIA elements and salts of Group VIA elements can be react into a single composition while the existence of the chelating agent. The chelating agent can alternatively be aromatic diamine compounds, alkyl diamine compounds or aliphatic diamine compounds. With the implementation of the present invention, manufacturing the CIGS or CIS films in large scale and simplifying the conventional manufacturing processes are capable of accomplishment.

14 Claims, 12 Drawing Sheets

PRODUCING METHOD OF INK COMPOSITION FOR FORMING ABSORPTION LAYER OF THIN FILM CELLS

CROSS REFERENCE TO RELATED APPLICATIONS

This application is a continuation-in-part of pending U.S. patent application Ser. No. 12/510,275 filed on Jul. 28, 2009, the entireties of which are incorporated herein by reference.

BACKGROUND OF THE INVENTION

1. Technical Field

The present invention relates to a method for preparing thin films of semiconductors for photovoltaic applications, and more particularly for preparing IB-IIIA-VIA thin films for thin film solar cells.

2. Description of Related Art

Solar cells are sorts of photovoltaic devices converting sunlight to useable electrical power. Because of improvement in conversion efficiency of cells and reduction of costs for manufacturing products in commercial scale, the interest in solar cells has obviously expended in recent years. The most common material applied to the solar cells is silicon, which is in form of a single or polycrystalline thick wafer. However, although the silicon-based solar cells hold the high conversion efficiency at over 20%, a significant level of thickness to absorb the sunlight has been retained so that the decrease of manufacturing cost and the expansion of application on irregular surface are restricted.

Another type of solar cells, namely the "thin-film", distinguished from the silicon-based solar cells has been developed rapidly due to the lower material cost and the competitive conversion efficiency. The typical structure of a thin-film solar cell essentially includes a substrate, a back contact layer, a p-type semiconductor absorption layer, an n-type junction buffer layer, and a transparent layer. Presently, one of the most potential absorption layers applied in thin-film solar cells uses copper indium diselenide ($CuInSe_2$, CIS) the variants of copper indium gallium diselenide ($Cu(In, Ga)Se_2$, CIGS), or any of these compounds with sulfur replacing the selenium. CIGS or CIS cells have demonstrated the highest efficiency and good stability as comparing with solar cells made from other absorption layer compounds. Sometimes, the acronym CIS and CIGS have been in common, use in literature, so CIGS is used here in an expanded meaning to represent the entire group of CIS based alloys.

To make an absorption layer using CIGS, one of the conventional techniques that yield high-quality CIGS layer for solar cell fabrication is co-evaporation of Cu, In, Ga, and Se onto a heated substrate in a vacuum. Another technique is a two-stage process that after formation of Cu, In, and Ga films on a substrate by means of sputtering or vapor deposition, selenization method under Se or $H_2Se$ is reacted with the precursor at elevated temperature. Among them, although the vacuum deposition has an advantage of making high-efficient absorption layer, it shows low materials utilization when making a large-sized absorption layer and also needs expensive equipment. Besides, hydrogen selenide is the most commonly used selenium bearing gas, which is extremely toxic to humans and requires great care in its use.

On account of the disadvantages of the vacuum deposition, methods for formation of CIGS layers using printing processes to coat an ink composition containing a metal oxide mixture particles on a substrate at high temperature are now proposed, which allow one to make a large-sized absorption layer uniform and reduce production costs in manufacturing solar cells. However, because the metal oxide precursor is very stable chemically and thermally to form large crystals, the low efficiency of the absorption layer could be shown.

In addition, regarding the conversion efficiency of CIGS cells, the band gaps of CIGS layer verify continuously from 1.0 (for copper indium selenide) to 1.7 eV (for copper gallium selenide). The band gap can be controlled by altering Ga doping concentrations, and in order to obtain the proper band gap energy, the doping process should be carried out with the compositional ratio of Ga/(In+Ga) ranged from 0.3 to 0.6. If Cu/(In+Ga) ratio is less than 1, a Cu-poor single chalcopyrite phase which has poor performance due to a small grain size is generated. On the other hand, when Cu/(In+Ga) ratio is more than 1, the grain size is increased which results in improved performance. But, in a Cu-rich phase, there are disadvantages that $Cu_2Se$ impurities are generated and derive a decrease in the light conversion efficiency caused by higher conductivity of $Cu_2Se$.

There are still some other methods for formation of CIGS materials disclosed. One is that Cu, In, Ga, and Se with low boiling-point amine compounds are reacted in an autoclave under high pressure, which requires higher equipment costs. The other is that complicated chemical compounds are reacted to generate CIGS materials under atmosphere pressure, which requires higher material costs. However, both of the two methods are unsuitable for mass production.

SUMMARY OF THE INVENTION

Accordingly, the primary object of the present invention is to solve the aforesaid disadvantages by providing an ink composition which is generated by using inexpensive equipment and easily accessible chemical compounds under high temperature and atmosphere pressure. Thus the process of forming CIGS or CIS thin film for solar cells can be simplified by only a printing process.

Another object of the present invention is to provide an ink composition comprising at least any one of groups IB, IIIA, and VIA in which the compositional ratios of Cu/(In+Ga) and Ga/(In+Ga) are freely regulated.

To achieve the foregoing and other objects, the present invention provides an ink composition for forming absorption layers of thin film cells comprising CIGS or CIS nanocrystals and a chelating agent specified for the CIGS or CIS nanocrystals. The chelating agent can be aromatic diamine compounds, alkyl diamine compounds, or aliphatic diamine compounds. In addition, the ink composition comprises alcoholic compounds, such as methanol, ethanol, propanol, butanol, or tert-butanol.

Furthermore, the present invention provides a method for producing the aforesaid ink composition for forming absorption layers of thin film cells. The method comprises the steps of:

a) providing a mixture comprising at least two substances selected from the group consisting of Group IB elements, Group IIIA elements. Group VIA elements, salts of Group IB elements, salts of Group IIIA elements and salts of Group VIA elements;

b) adding a chelating agent into the mixture, wherein the chelating agent has a boiling point higher than 200° C. and is selected from the group consisting of aromatic diamine compounds, alkyl diamine compounds, and aliphatic diamine compounds; and c) heating the chelating agent to a first temperature which exceeds a reaction temperature of forming nanocrystals from the mixture, and reacting the chelating agent with the mixture in an inert gas environment under atmosphere pressure to form a solution of the ink composition.

In one aspect, additional steps are included. The steps include the step of cooling the solution to a second temperature which is between a inciting point of the solution and the first temperature and allows the solution being stirred; and the step of mixing the cooled solution with alcoholic compounds at the second temperature.

The present invention also provides a method for producing an ink composition for forming absorption layers of thin film cells, comprising the steps of:
a) providing a mixture of copper, gallium, indium, and selenium;
b) adding a chelating agent into the mixture, wherein the chelating agent is selected from the group consisting of isophoronediamine and m-phenylenediamine; and
c) heating the chelating agent to the temperature between 230° C. and 260° C., and reacting the chelating agent with the mixture in an inert gas environment under atmosphere pressure to form a solution of the ink composition.

The present invention further provides a method for producing an ink composition for forming absorption layers of thin film cells, comprising the steps of:
a) providing a mixture of copper, indium, and selenium;
b) adding a chelating agent into the texture, wherein the chelating agent is hexanediamine; and
c) heating the chelating agent to the temperature between 200° C. and 210° C., and reacting the chelating agent with the mixture in an inert gas environment under atmosphere pressure to form a solution of the ink composition.

According to the ink composition for forming absorption layers of thin film cells and the producing method set forth above, CIGS or CIS thin film can be formed by only a simple coating and printing process without requirement of alternative vacuum processing or complex equipment. Particularly, the method is applied in a single-stage process instead of the conventional multiple-stage process so that reduction of manufacturing costs is capable of accomplishment. The present invention provides a simpler, lower-priced, faster, and less environmental harm method of synthesizing ink composition. Besides, the present invention can obtain advantages in both of the cases that the compositional ratio of Cu/(In+Ga) is more or less than 1 according to the possibility of free regulation of the compositional ratios of Cu/(In+Ga) and Ga/(In+Ga).

The foregoing, as well as additional objects, features and advantages of the invention will be more readily apparent from the following detailed description, which proceeds with reference to the accompanying drawings.

DETAILED DESCRIPTION OF THE EMBODIMENTS OF THE INVENTION

Figure 1:
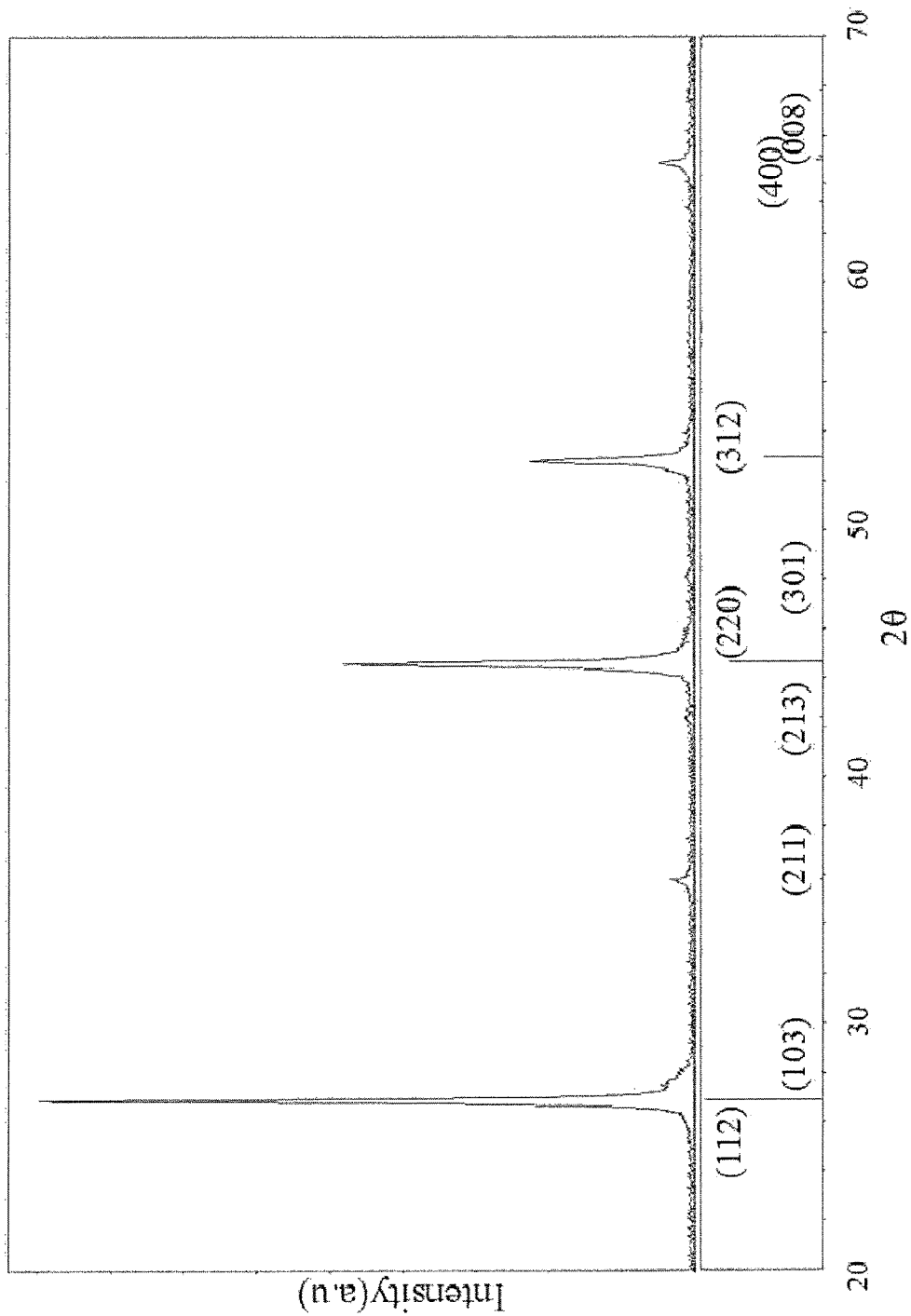
FIG. 1 shows the X-ray diffraction (XRD) pattern of a $CuIn_{1-x}Ga_xSe_2$ powder formed in the example I of the present invention.

The present invention discloses an ink composition for forming absorption layers of thin film cells comprising CIGS or CIS nanocrystals and a chelating agent specified for the CIGS or CIS nanocrystals. The ink composition can be directly applied on a substrate to form absorption layers of thin film cells. In addition, the CIGS or CIS nanocrystals can be extracted out of the ink composition in liquid form to form CIGS or CIS powders which can be manufactured into target materials for sputtering the absorption layers of thin film cells on the substrate.

The chelating agent is selected from the group consisting of aromatic diamine compounds, alkyl diamine compounds, and aliphatic diamine compounds. The aromatic diamine compounds include phenylenediamine, diaminotoluene, xylenediamine, 2,4-diethyltoluenediamine, 2,6-diethyltoluenediamine, diaminonaphthalene, diaminophenanthrene, and diaminoanthracene. The alkyl diamine compounds include hexanediamine, heptanediamine, and octanediamine. The aliphatic diamine compound can be isophoronediamine.

In addition, the ink composition further comprises alcoholic compounds selected from a group consisting of methanol, ethanol, propanol, butanol, and tert-butanol. The alcoholic compounds prevent the chelating agent such as m-phenylenediamine or hexanediamine from solidification. In addition, the chelating agent also can be served as a diluent to modulate the concentration of the ink composition.

The present invention further provides a method for producing the ink composition forming absorption layers of thin film cells. The method includes the steps as follow:
a) providing a mixture comprising at least two substances selected from the group consisting of Group IB elements, Group IIIA elements, Group VIA elements, salts of Group IB elements, salts of Group IIIA elements and salts of Group VIA elements;
b) adding a chelating agent into the mixture, wherein the chelating agent has a boiling point higher than 200° C. and is selected from the group consisting of aromatic diamine compounds, alkyl diamine compounds, and aliphatic diamine compounds; and
c) heating the chelating agent to a first temperature which exceeds a reaction temperature of forming nano crystals from the mixture, and reacting the chelating agent with the mixture in an inert gas environment under atmosphere pressure to form a solution of the ink composition.

The IB group elements include copper, silver, and gold the IIIA group, elements include aluminum, gallium, indium, and thallium and the VIA group element can be selenium. Moreover, the mixture can also alternatively include the salts of group IB elements, salts of group IIIA elements, and/or salts of group VIA elements, such as CuCl, InCl$_3$, GaCl$_3$, CuBr, InBr$_3$, GaBr$_3$, CuI, InI$_3$ and GaI$_3$.

Therefore, the mixture of these elements or salts mentioned above is inexpensive and easily accessible raw materials for generating the CIGS or CIS materials of the absorption layers of thin film cells. For example the mixture of copper, gallium, indium, and selenium can be raw materials for generating CIGS materials, and the mixture of copper, indium, and selenium can be raw materials for generating CIS materials. The provided mixture decides the resulted materials.

Besides, the chelating agent which has a boiling point higher than 200° C. is heated and served to provide enough activation energy for the mixture to generate the CIGS or CIS materials. The higher the boiling point of the chelating agent is, the higher the temperature of the chelating agent can be heated. Thus, the chelating agent can provide higher activation energy.

Generally speaking, the boiling point of the chelating agent is between 200° C. and 300° C. The chelating agent which has a boiling point between 200° C. and 260° C. can provide the mixture enough energy to form the CIS materials, and the chelating agent which has a boiling point between 220° C. and 300° C. can provide the mixture enough energy to form the CIGS or CIS materials.

The chelating agent may be in a solid state or in a liquid state at room temperature. It requires a further heating step before step (c) if the chelating agent is in the solid state at room temperature. After the chelating agent is heated to the liquid state, the step (c) is executed. Chelating agents in a liquid state at room temperature are convenient for processing chemical reaction, and enable an easy and simple process to mass-produce of the ink composition forming absorption layers of thin film cells.

In the step (c), the chelating agent is heated to a first temperature and reacted with the mixture in an inert gas environment under atmosphere pressure to form a solution of the ink composition. The first temperature must exceed the reaction temperature of forming nanocrystals from the mixture. Take forming the CIGS nanocrystals for examples, the first temperature may be between 220° C. and 280° C. Besides, the first temperature may be between 200° C. and 230° C. for forming the CIS nanocrystals. This process can be executed under atmosphere pressure so as to lower the cost of required equipment and simplify the process to mass-produce the CIGS or CIS materials. The above inert gas can be nitrogen or argon.

Because some of the chelating agents are in the solid state at room temperature, additional steps are included to prevent the solution from solidification. The steps include: the step of cooling the solution to a second temperature which is between a melting point of the solution and the first temperature and allows the solution being stirred; and the following step of miring the cooled solution with alcoholic compounds at the second temperature. The second temperature may be between 80° C. and 180° C., especially between 80° C. and 140° C.

Although the ink composition can be directly applied on the substrate to form absorption layers of thin film cells, the ink composition in the liquid state is not easily transported. Another application of the ink composition is to obtain the CIGS or CIS powders which are easily transported. In order to obtain the CIGS or CIS powders, the alcoholic compounds is added in the ink composition for the agglomeration of the CIGS or CIS nanocrystals from nano-grade size to micro-grade size. Thus, the agglomerated CIGS or CIS can be filtered with the filter paper.

After the filtration, the filtrate may include the chelating agent, the alcoholic compounds, optionally water and optionally acetone. The constitution of the filtrate depends on the medium added during the above process. Moreover, the chelating agent can be recycled by means of conventional reduced pressure distillation technique to extract the chelating agent from the filtrate. Thus the chelating agent can be reused, thereby to provide an environmental-friendly and low-cost solution.

EXAMPLE I

This example provides a producing method of an ink composition with inexpensive and conventional equipment under atmosphere pressure as follow: first, preparing a 500 ml glass reactor with a magnetic stirrer under the atmosphere of N$_2$ for 30 minutes; adding 250 g m-phenylenediamine powders with a boiling point of 282° C. into the glass reactor with 18 g copper metal powders, 27 g indium powders, 5.2 g gallium, and 51 g selenium powders (all the elements are in 99.99% purity), wherein a gallium metal is preheated at the temperature of 40-50° C. for 30 minutes to the melting state (the liquid gallium) before dropping into the glass reactor; heating the glass reactor to the temperature of 180° C. for 1 hour when m-phenylenediamine powders melt to the liquid state; stirring the mixture of m-phenylenediamine, copper, indium, gallium, and selenium; and reheating the glass reactor at the temperature of 240-260° C. for 48 hours to provide enough activation energy for the copper, indium, gallium, and selenium to form the CMS nanocrystals. Then the glass reactor is cooled down to the temperature of 170° C., and 100 ml ethanol (99%) is dropped into the cooled glass reactor to prevent the solution in the glass reactor from solidification and then the solution in the glass reactor is boiled for 2 hours. Finally, after quenching to room temperature, black liquid products which include the produced CIGS nanocrystals are generated.

The black liquid products are smeared on a glass substrate by a dropper. The black liquid layer on the glass substrate is heated at 200° C. holding for 1 hour under the pressure of 0.1 torr to obtain a precursor film. The precursor film formed on the substrate is heated again at the temperature of 400-450° C. for 1 hour to produce a dense film which is smeared on a molybdenum-substrate to form an absorption layer.

On the other hand, the black liquid products are alternatively transferred into a filter (Whatman#2) and washed with 2000 ml ethanol and 2000 ml acetone. Then the black products are dried at the temperature of 60° C. for 12 hours to get the final, products, which are 100 g black CIGS nanopowders.

EXAMPLE II

The present invention also provides a second example for producing an ink composition with inexpensive and conventional equipment under atmosphere pressure.

Initially, preparing a 500 ml glass reactor with a magnetic stirrer under the atmosphere of N$_2$ for 30 minutes; adding 250 g hexanediamine which has a boiling pain of 205° C. into the glass reactor with 25.46 g copper metal powders, 46 g indium powders, and 67 g selenium powders (all the elements are in 99.99% purity), wherein the hexanediamine is preheated at the temperature of 40-50° C. for 30 minutes to the melting state before adding into the glass reactor; heating the glass reactor to the temperature of 200-210° C. for 48 hour to provide enough activation energy for the copper, indium, and selenium to form the CIS nanocrystals. Then the glass reactor is cooled down the temperature of 120° C., and 100 ml ethanol (99%) is dropped into the cooled glass reactor to prevent the solution in the glass reactor from solidification and the solution in the glass reactor is boiled for 2 hours. Finally, after quenching to room temperature black liquid products which include the produced CIS nanocrystals are generated.

The black liquid products are transferred into a filter (Whatman#2) and washed with 2500 ml ethanol and 2500 ml acetone. Then the black, liquid products are dried at the temperature of 60° C. for 12 hours to get the final products, which are 150 g black CIS nanopowders.

EXAMPLE III

The present invention also provides a third example for producing an ink composition with inexpensive and conventional equipment under atmosphere pressure.

Initially, preparing a 250 ml glass reactor with magnetic stirrer under the atmosphere of $N_2$ for 30 minutes to provide a stable environment for the following steps; adding 50 g isophoronediamine which has a boiling point of 245° C. into the glass reactor with 4.5 g copper metal powders, 6.7 g indium powders, 1.3 g liquid gallium, and 12.8 g selenium powders (all the elements are in 99.99% purity), wherein a gallium metal is preheated at the temperature of 40-50° C. for 30 minutes to the melting state (the liquid gallium) before dropping into the glass reactor; stirring the mixture in the glass reactor and heating the glass reactor at the temperature of 230-240° C. for 48 hours. Then the glass reactor is cooled down to the temperature of 30° C. 50 ml ethanol (99%) is optionally dropped into the cooled glass reactor to dilute the mixture in the glass reactor to the desired concentration. After that, the mixture stirred for 2 hours. The black liquid products which include produced CIGS nanocrystals are generated.

The black liquid products are transferred into a filter (Whatman#2) and washed with 500 ml ethanol 500 ml acetone and optionally 1000 ml water whose solubility is better. Then the black products is dried at the temperature of 60° C. for 12 hours to get the final products, which are 22 g black CIGS nanopowders.

EXAMPLE IV

The present invention also provides a fourth example for mass-producing an ink composition with inexpensive and conventional equipment under atmosphere pressure.

Initially, preparing a 2000 ml glass reactor with a magnetic stirrer under the atmosphere of $N_2$ for 30 minutes; adding 750 g isophoronediamine into the glass reactor with 180 g copper metal powders, 270 g indium powders, 52 g liquid gallium, and 510 g selenium powders (all the elements are in 99.99% purity), wherein a gallium metal is preheated at the temperature of 40-50° C. for 30 minutes to the melting state (liquid gallium) before dropping into the glass reactor; stirring the mixture in the glass reactor and heating the glass reactor at the temperature of 230-240° C. for 48 hours. Then the glass reactor is cooled down to the temperature of 30° C., and 200 ml ethanol (99%) is optionally dropped into the cooled glass reactor and stirred for 2 hours. Then, black liquid products which include generated CIGS nanocrystals are generated.

The black liquid products are smeared on a glass substrate by a dropper. The black liquid layer on the glass substrate is heated at 200° C. holding for 1 hour under the pressure of 0.1 torr to obtain a precursor film. The precursor film formed on the substrate is heated again at the temperature of 400-450° C. for 1 hour to produce a dense film which is smeared on a molybdenum-substrate to form an absorption layer.

The black liquid products are transferred into a filter (Whatman#2) and washed with 4000 ml ethanol and 2000 ml acetone. With the addition of the ethanol, the generated CIGS nanocrystals can be agglomerated to the micro-grade size so as to be able to be filtered with the filter paper. Then the black products are dried at the temperature of 60° C. for 12 hours to get the final products, which are 1 kg black CIGS nanopowders.

Figure 2:
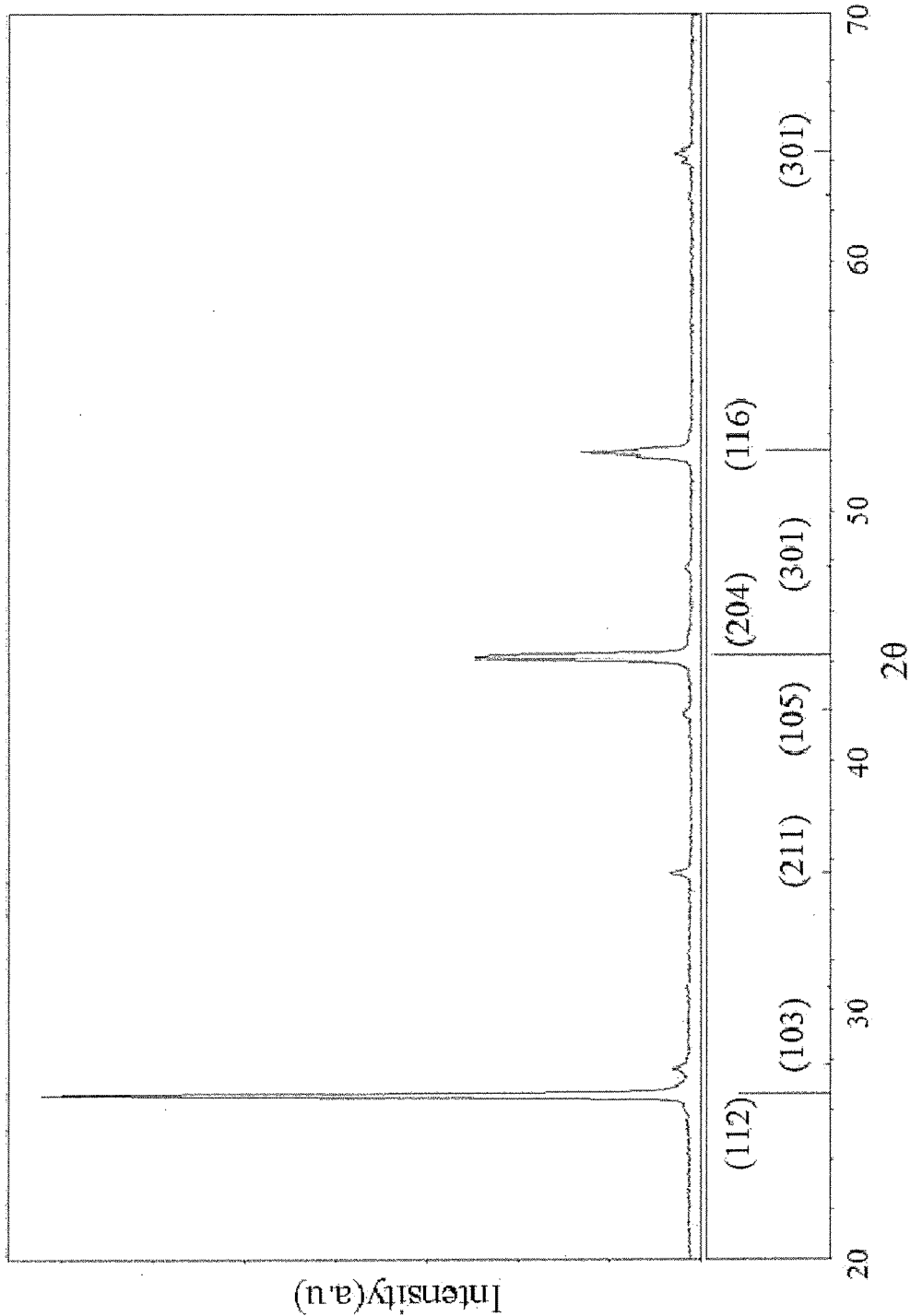
FIG. 2 shows the X-ray diffraction (XRD) pattern of a $CuInSe_2$ powder formed in the example II of the present invention.
Figure 3:
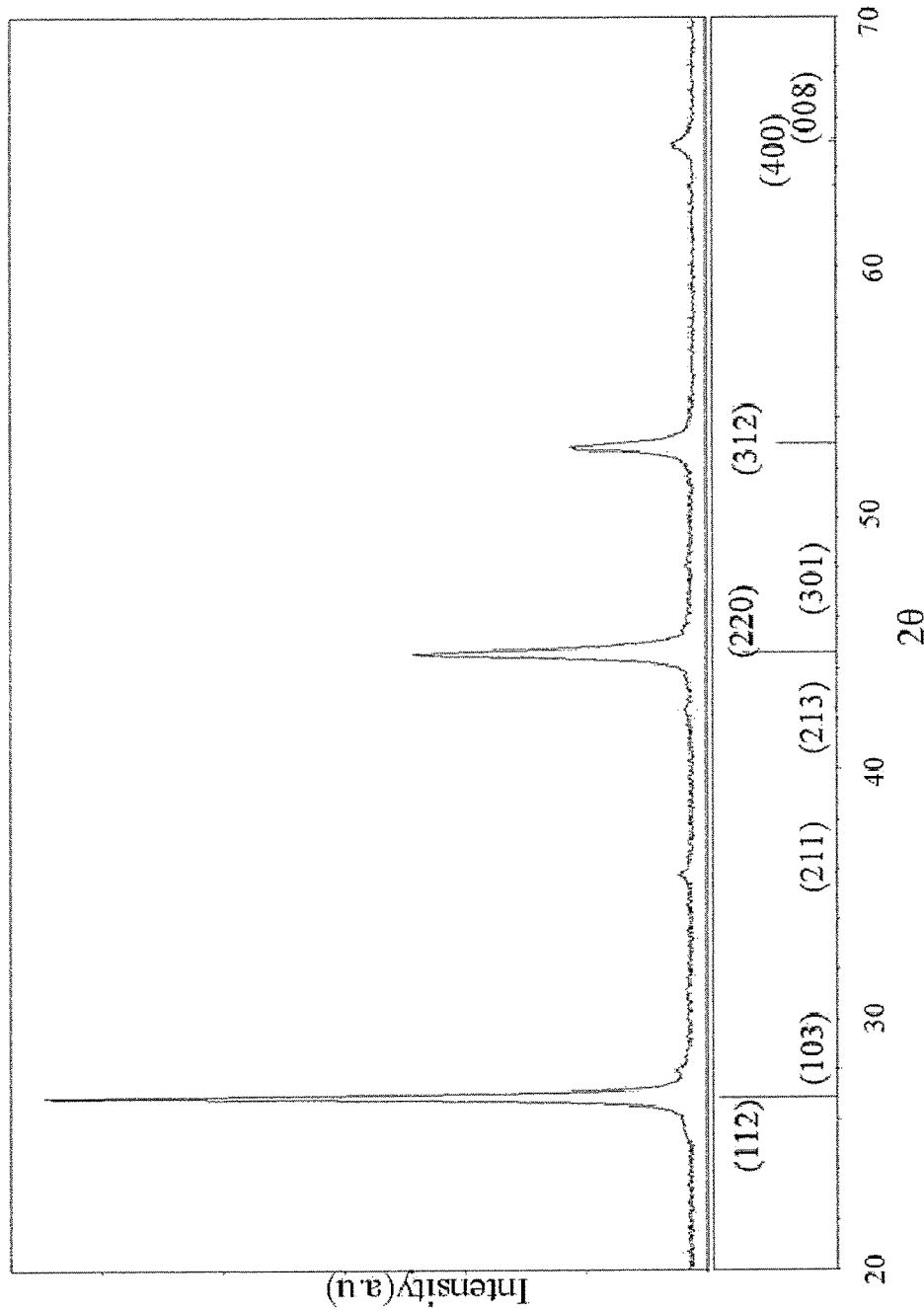
FIG. 3 shows the X-ray diffraction (XRD) pattern of a $CuIn_{1-x}Ga_xSe_2$ powder formed in the example III of the present invention.
Figure 4:
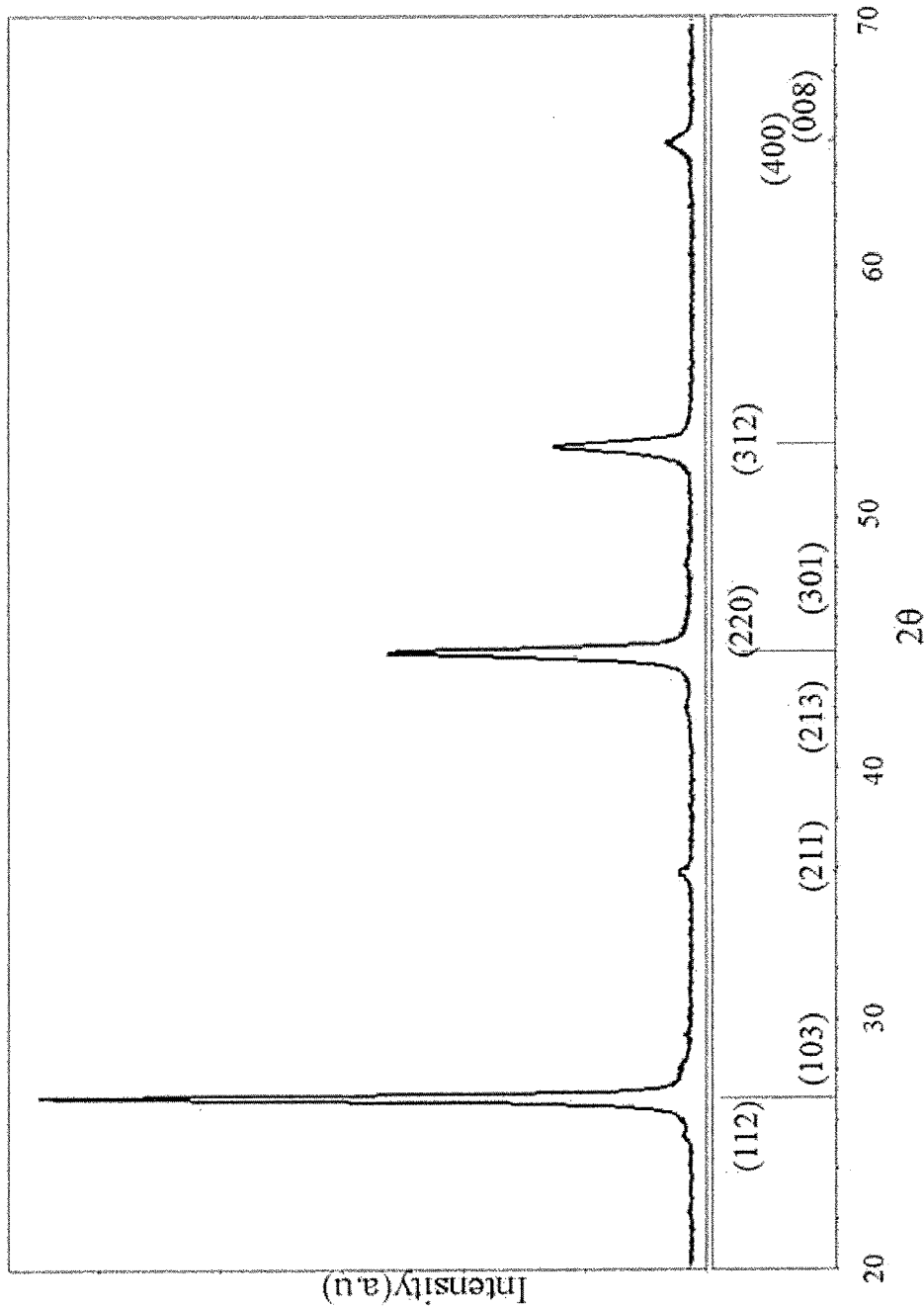
FIG. 4 shows the X-ray diffraction (XRD) pattern of a $CuIn_{1-x}Ga_xSe_2$ powder formed in the example IV of the present invention.
Figure 5:
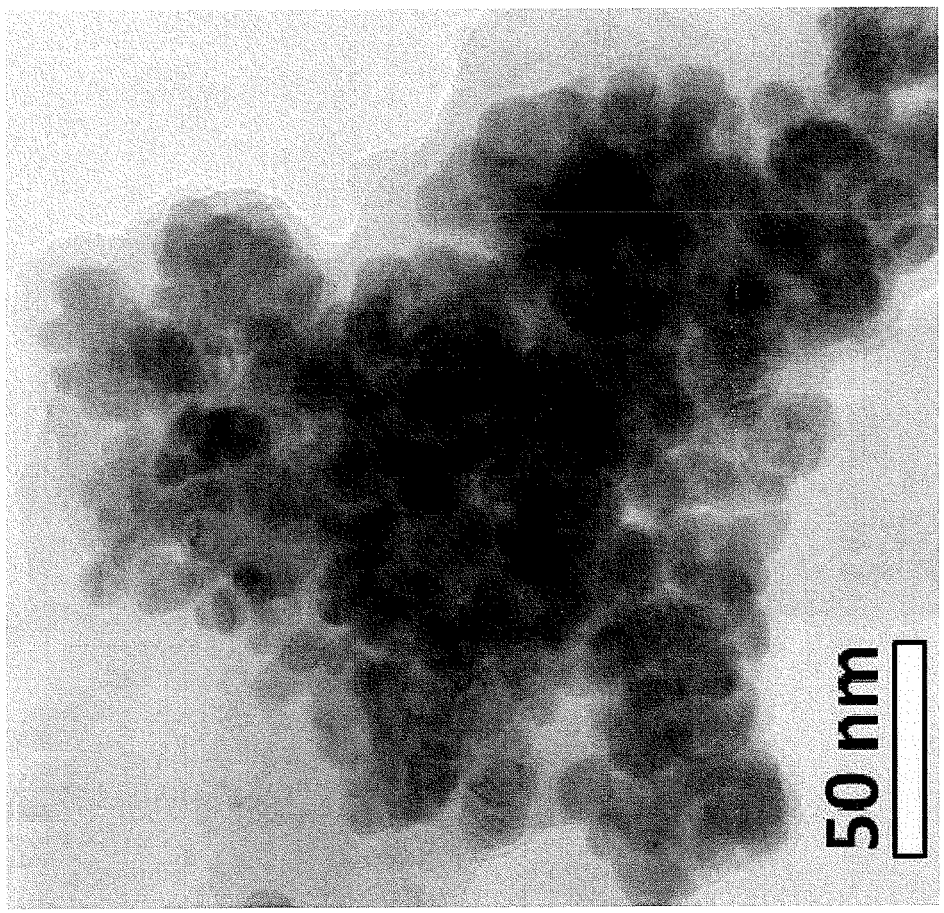
FIG. 5 shows the TEM image of a $CuIn_{1-x}Ga_xSe_2$ powder formed in the example I of the present invention.
Figure 6:
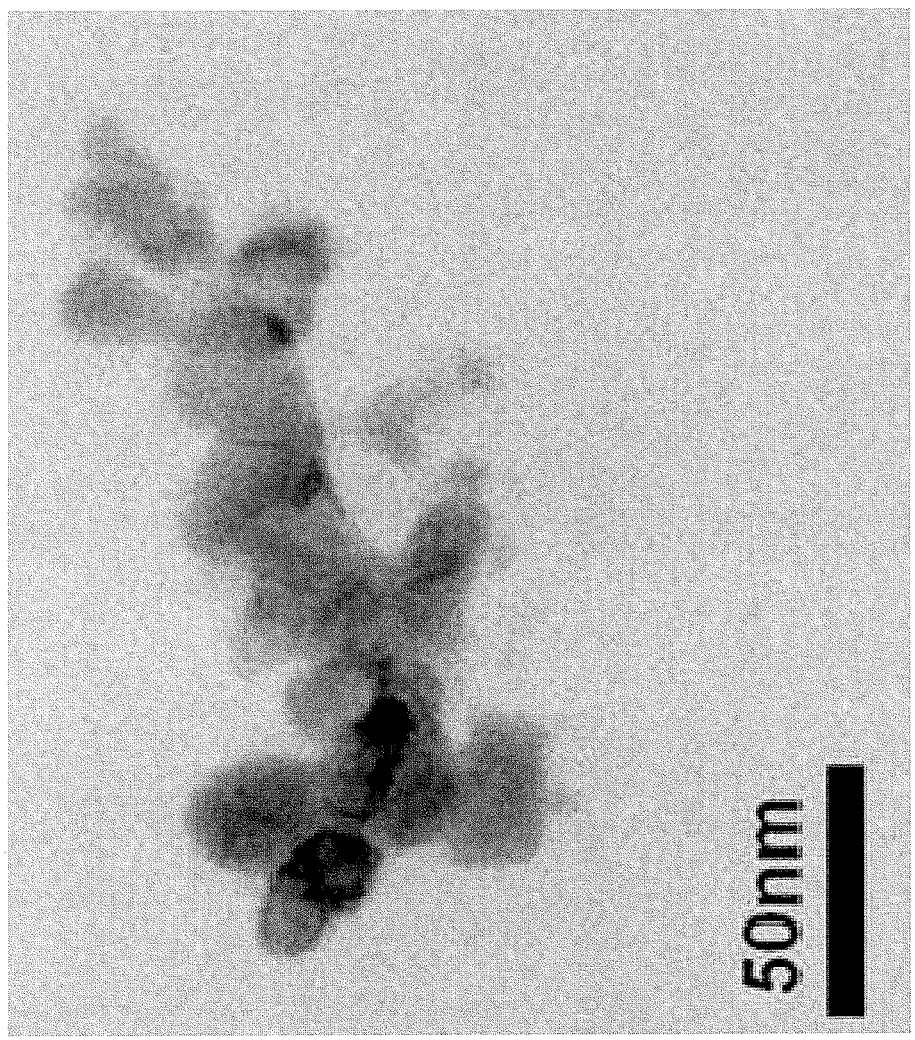
FIG. 6 shows the TEM image of a $CuInSe_2$ powder formed in the example II of the present invention.
Figure 7:
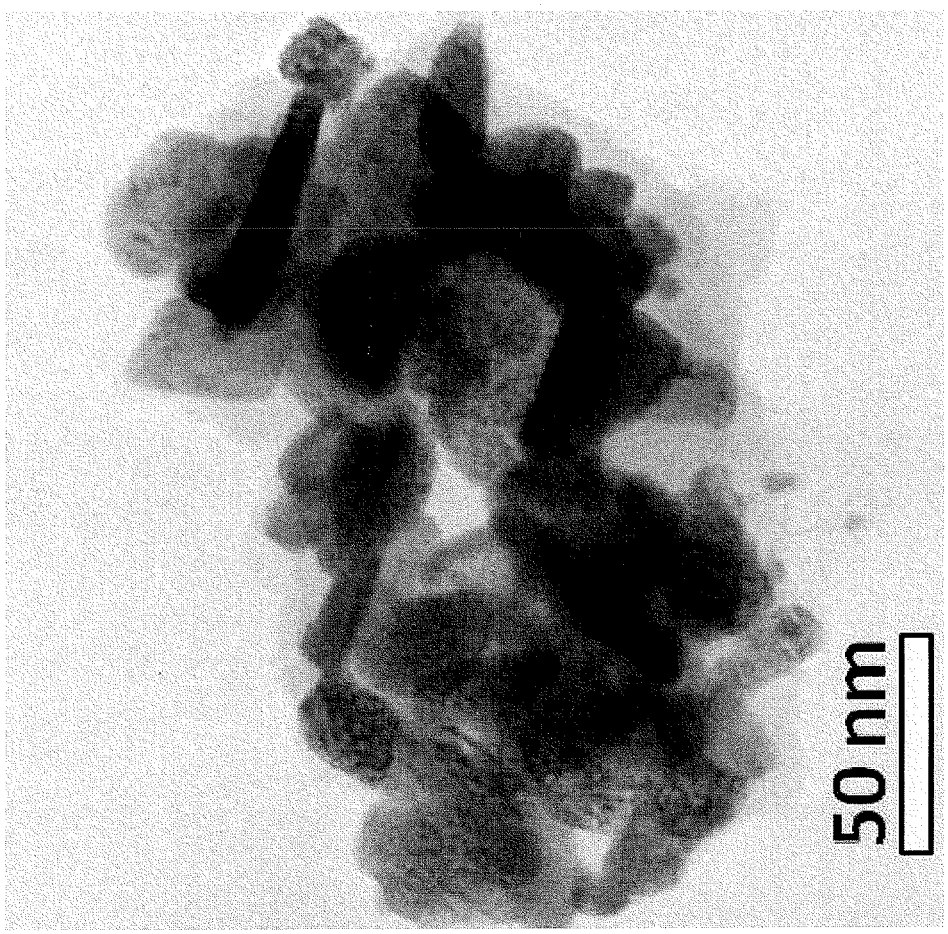
FIG. 7 shows the TEM age of a $CuIn_{1-x}Ga_xSe_2$ powder formed in the example III of the present invention.
Figure 8:
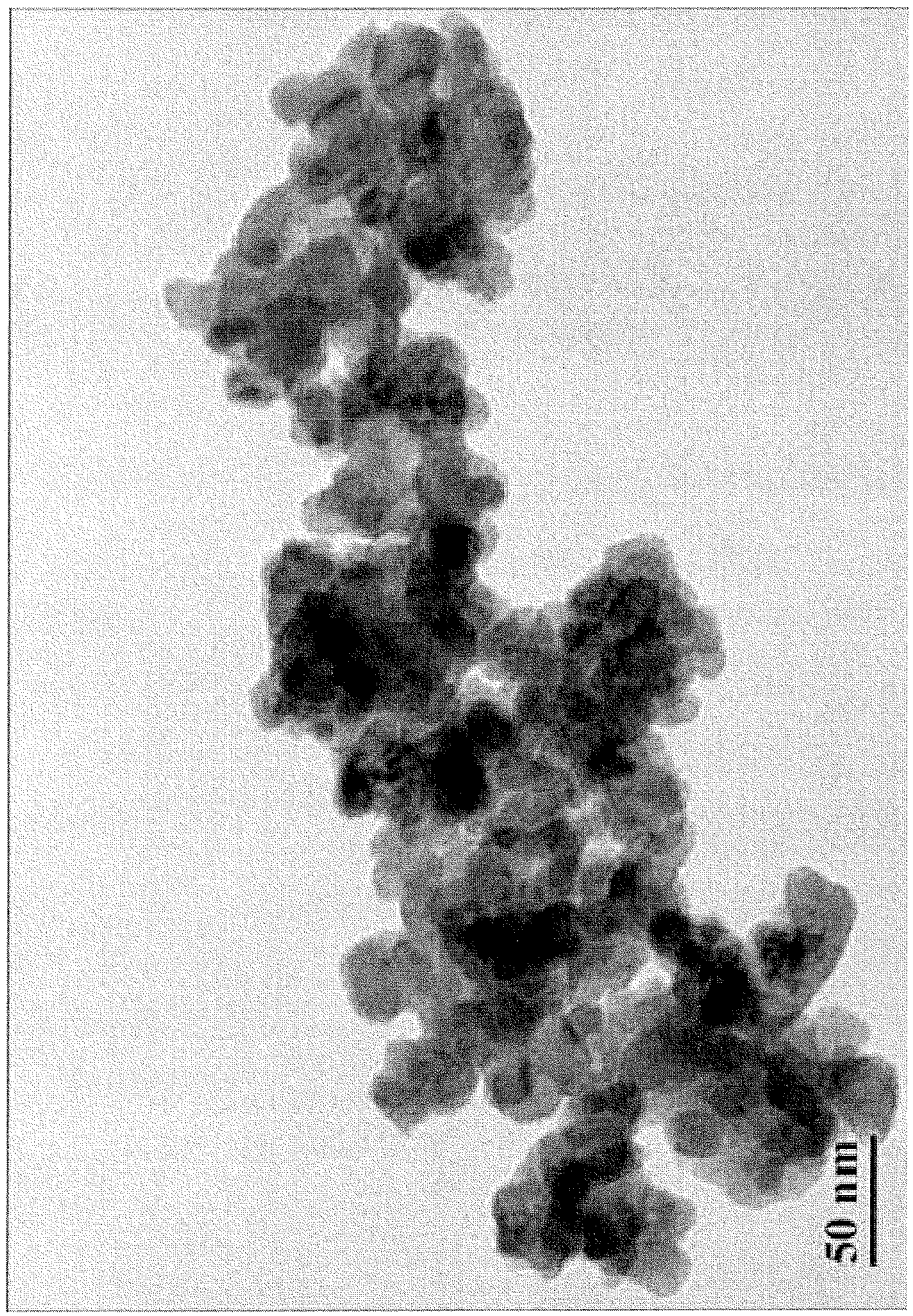
FIG. 8 shows the TEM image of a $CuIn_{1-x}Ga_xSe_2$ powder formed in the example IV of the present invention.
Figure 9:
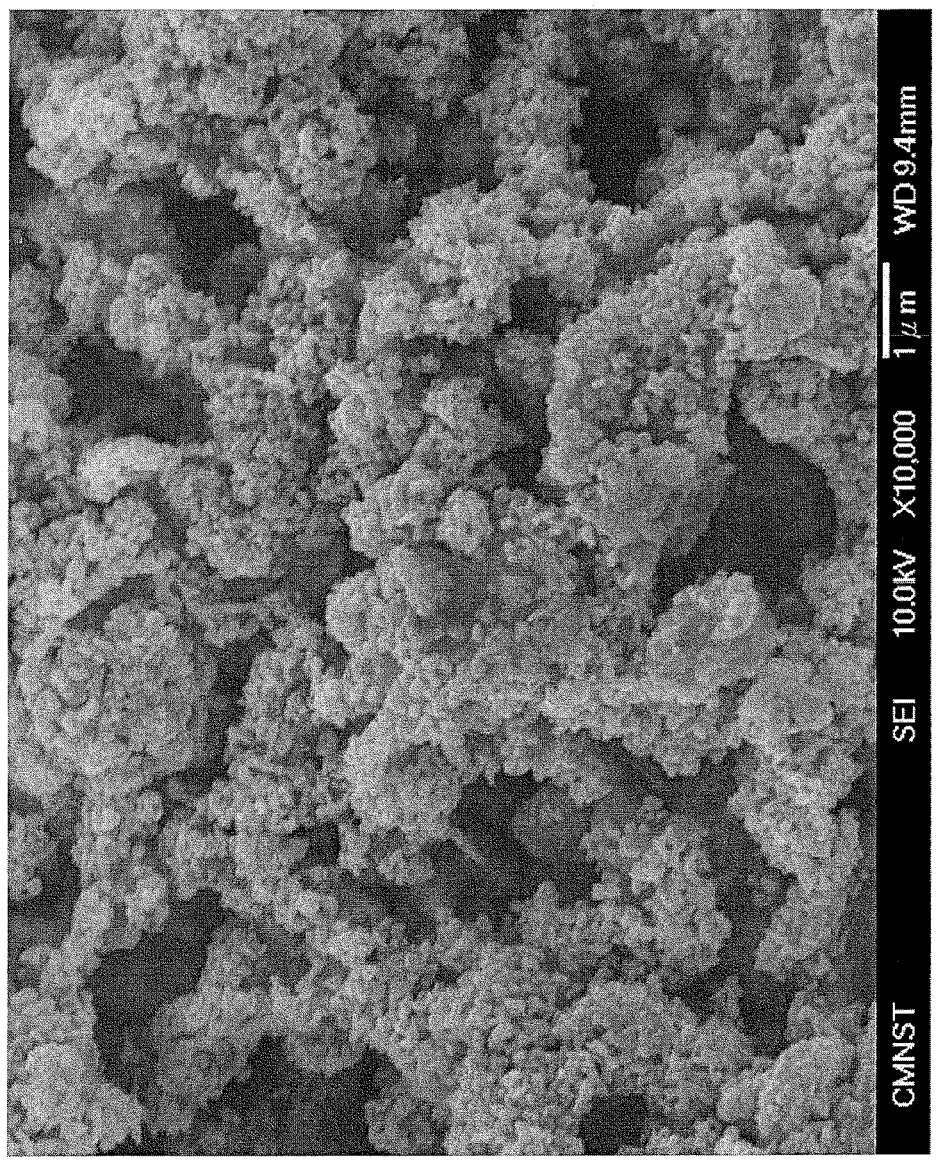
FIG. 9 shows the SEM image of a $CuIn_{1-x}Ga_xSe_2$ powder formed in the example I of the present invention.
Figure 10:
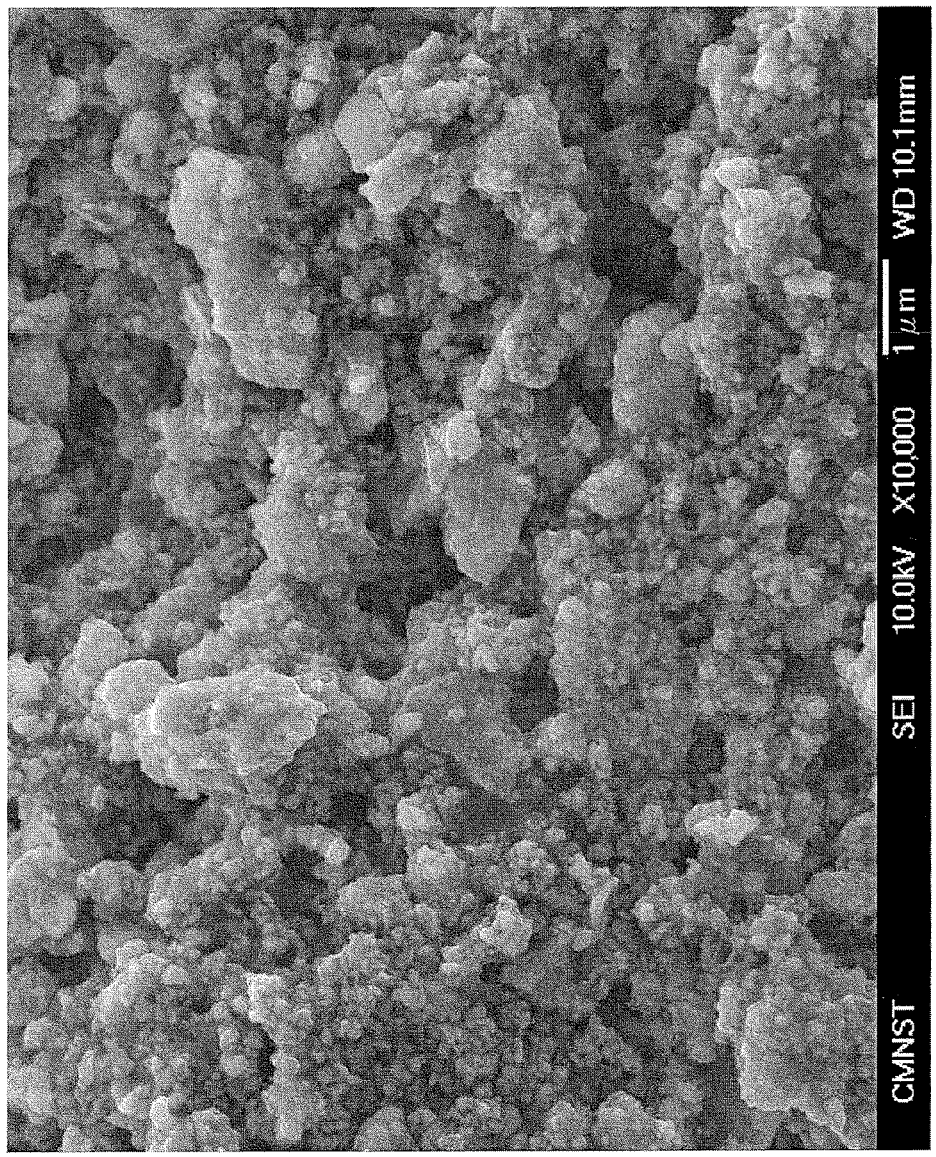
FIG. 10 shows the SEM image of a $CuInSe_2$ powder formed in the example II of the present invention.
Figure 11:
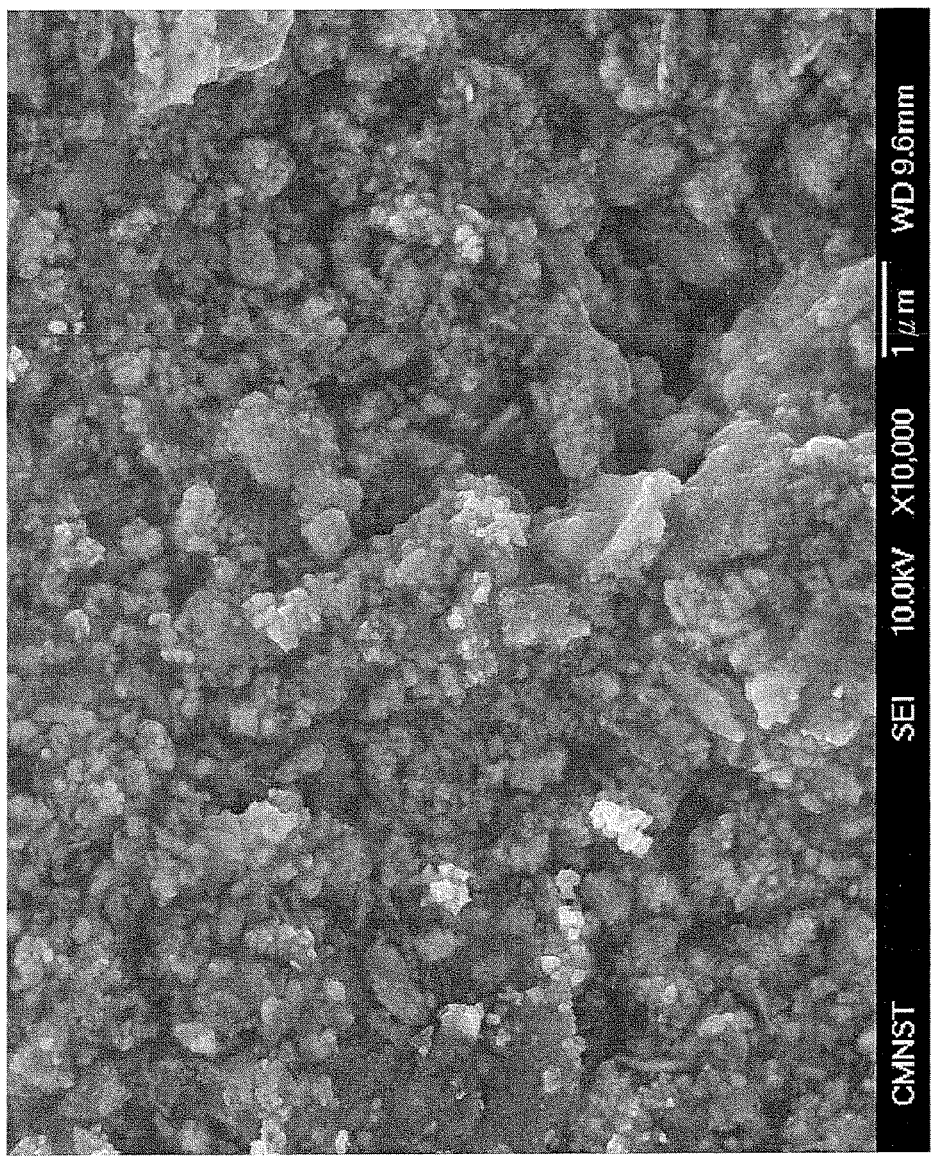
FIG. 11 shows the SEM image of a $CuIn_{1-x}Ga_xSe_2$ powder formed in the example III of the present invention.
Figure 12:
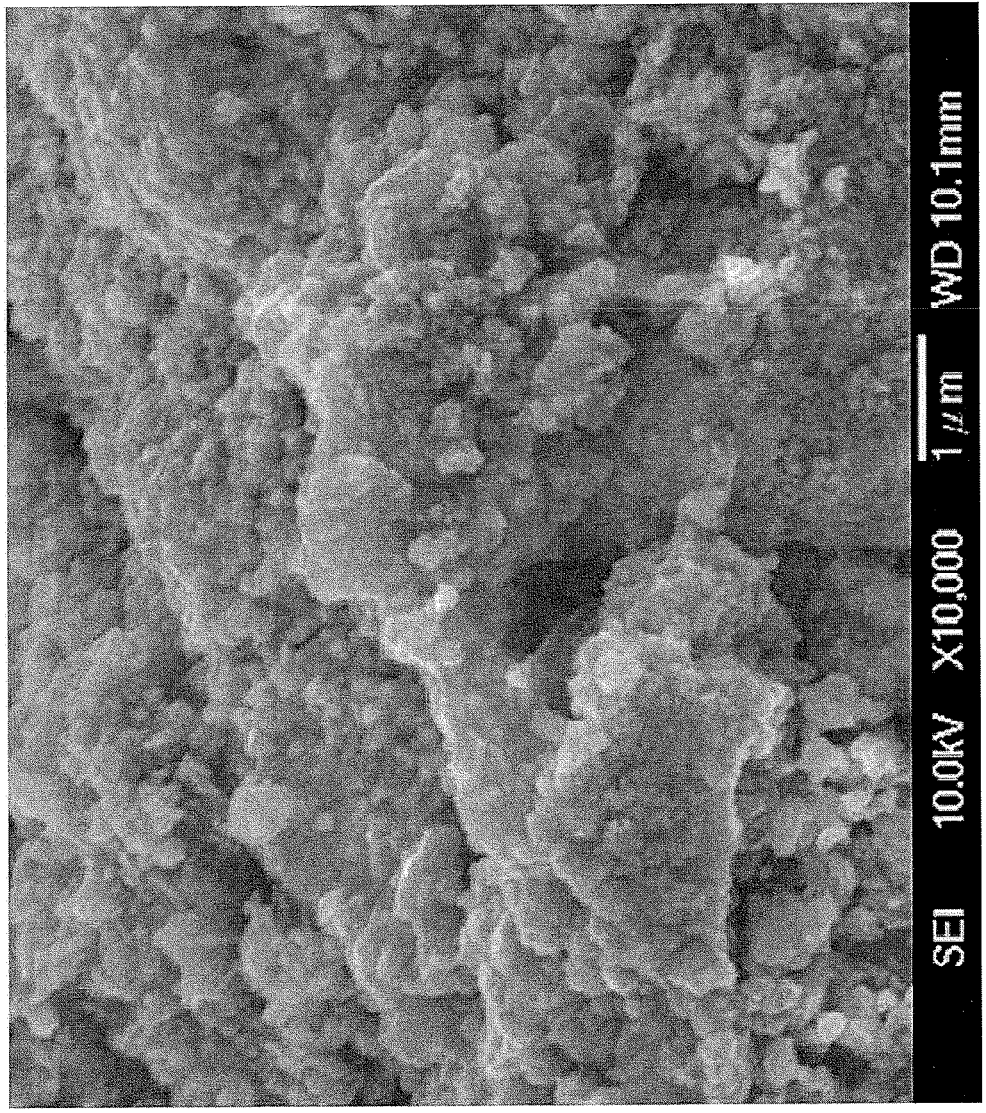
FIG. 12 shows the SEM image of a $CuIn_{1-x}Ga_xSe_2$ powder formed in the example IV of the present invention.

FIGS. 1-4 show X-ray diffraction (XRD) patterns of the products of the examples I, II, III, and IV in which XRD data are collected by using Karaltay DX-2700 powder X-ray diffraction instrument. In FIGS. 1, 3, and 4, all the peaks in the XRD patterns can be indexed to a tetragonal chalcopyrite structure, the strongest diffraction peak is around 2 theta at about 26.7 degrees corresponds to diffraction from (112) plane, while the other peaks at 2 theta at about 44.35 and 52.7 degrees corresponds to diffraction from (220) and (312) planes. These planes are referred to the CIGS crystalline lattice. In FIG. 2, the strongest diffraction peak is around 2 theta at about 26.7 degrees corresponds to diffraction from (112) plane, while the other peaks at 2 theta at about 44.35 and 52.7 degrees corresponds to diffraction from (204) and (116) planes. These planes are referred to the CIS crystalline lattice.

In addition, the products of the above examples I, II, III and IV are also prepared for transmission electron microscopy (TEM; JEOL TEM-2100F) characterization and field emission scanning electron microscopy (FE-SEM; JEOL FE-SEM 7000F) characterization. FIGS. 5-8 show the TEM image of CIGS or CIS nanocrystals generated from the examples I, II, III and IV. The scale bar is 50 nm. FIGS. 9-12 present SEM micrographs of CIS nanocrystals or CMS nanocrystals, which show the typical morphology of CIS or CIGS nanocrystals. The scale bar is 1 μm. They are concluded that the average size of the CIGS or CIS nanocrystals is estimated to be 10-200 nm, wherein the shown large, size of nanocrystals results from agglomeration in product formation.

As apparent from the foregoing, the method of the present invention is capable of producing an ink composition for forming CIGS film. The chelating agent including aromatic diamine compounds, alkyl diamine compounds, and aliphatic diamine compounds easily dissolves the reactant elements or salts, such as selenium and copper, so that the CIGS film can be produced in a simple single-stage process instead of the conventional multiple-stage process which requires alternative vacuum processing or complex equipment.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for producing an ink composition for forming absorption layers of thin film cells, comprising the steps of:
    providing a mixture comprising at least two substances selected from the group consisting of Group IB elements, Group IIIA elements, Group VIA elements, salts of Group IB elements, salts of Group IIIA elements and salts of Group VIA elements;
    adding a chelating agent into the mixture, wherein the chelating agent is isophoronediamine and has a boiling point higher than 200° C.; and heating the chelating agent to a first temperature which exceeds a reaction temperature of forming nanocrystals from the mixture, and reacting the chelating agent with the mixture in an inert gas environment under atmosphere pressure to form a solution of the ink composition.

2. The method of claim 1 further comprising the steps of:
cooling the solution to a second temperature which is between a melting point of the solution and the first temperature and allows the solution being stirred; and
mixing the cooled solution with alcoholic compounds at the second temperature.

3. The method of claim 2, wherein the alcoholic compounds are selected from a group consisting of methanol, ethanol, propanol, butanol, and tert-butanol.

4. The method of claim 2, wherein the second temperature is between 80° C. and 180° C.

5. The method of claim 2, wherein the second temperature is between 80° C. and 140° C.

6. The method of claim 1, wherein the elements are selected from the group consisting of copper, aluminum, gallium, indium, and selenium.

7. The method of claim 1, wherein the salts are selected from $CuCl$, $InCl_3$, $GaCl_3$, $CuBr$, $InBr_3$, $GaBr_3$, $CuI$, $InI_3$, and $GaI_3$.

8. The method of claim 1, wherein the inert gas is selected from nitrogen and argon.

9. The method of claim 1, wherein the boiling point of the chelating agent is between 220° C. and 300° C.

10. The method of claim 1, wherein the boiling point of the chelating agent is higher than 200° C. to 260° C.

11. The method of claim 1, wherein the first temperature is between 220° C. and 280° C.

12. The method of claim 1, wherein the first temperature is between 200° C. and 230° C.

13. A method for producing an ink composition for forming absorption layers of thin film cells, comprising the steps of:
providing a mixture of copper, gallium, indium, and selenium;
adding a chelating agent into the mixture, wherein the chelating agent is isophoronediamine; and
heating the chelating agent to the temperature between 230° C. and 260° C., and reacting the chelating agent with the mixture in an inert gas environment under atmosphere pressure to form a solution of the ink composition.

14. The method of claim 13 further comprising the steps of:
cooling the solution to a temperature between 80° C. and 180° C. and allowing the solution being stirred; and
mixing the cooled solution with alcoholic compounds at the temperature between 80° C. and 180° C.

* * * * *